United States Patent

[11] 3,607,450

[72] Inventor David A. Kiewit
Santa Monica, Calif.
[21] Appl. No. 861,388
[22] Filed Sept. 26, 1969
[45] Patented Sept. 21, 1971
[73] Assignee The United States of America as represented by the Secretary of the Air Force

[54] LEAD SULFIDE ION IMPLANTATION MASK
1 Claim, 5 Drawing Figs.

[52] U.S. Cl. .......... 148/1.5, 29/576, 148/186, 148/187
[51] Int. Cl. .......... H01l 7/54
[50] Field of Search .......... 148/1.5, 186, 187; 29/576, 578

[56] References Cited
UNITED STATES PATENTS

| | | | |
|---|---|---|---|
| 3,431,150 | 3/1969 | Dolan, Jr. et al. | 148/1.5 |
| 3,523,042 | 8/1970 | Bower et al. | 148/1.5 |

*Primary Examiner*—L. Dewayne Rutledge
*Assistant Examiner*—R. A. Lester
*Attorneys*—Harry A. Herbert, Jr. and William J. O'Brien

ABSTRACT: A method for masking semiconductor bodies during the ion beam implantation of contaminants into preselected portions of a semiconductor material. The method involves the deposition of a lead sulfide film onto the surface portion of a semiconductor material and the formation of the film into a mask through the use of conventional photoresist and chemical etching techniques. The lead sulfide masked semiconductor body can then be subjected to an ion implantation operation.

INVENTOR.
DAVID A. KIEWIT
BY Harry A Herbert Jr
and
William J. O'Brien
ATTORNEYS

LEAD SULFIDE ION IMPLANTATION MASK

BACKGROUND OF THE INVENTION

This invention relates to the fabrication of semiconductor devices. More particularly this invention concerns itself with ion beam implantation systems used in the fabrication of semiconductor devices and to a masking technique for use therewith.

The process of implanting designated impurities into a semiconductor body by ionic bombardment is well known in the art of transistor technology and reference is made to U.S. Pat. No. 2,787,564 to Shockley for a more detailed description of the process. In general, however, ion beam implantation entails the bombardment of a semiconductor substrate of one conductivity type with a monoenergetic beam of ions of a significant impurity element having a conductivity type opposite to that of the semiconductor substrate. The implantation of the impurity element is conducted in such a manner as to convert the conductivity of a thin surface portion in the interior of the substrate body from one type to another. This is accomplished by controlling the energy level of the ion beam so that the ions penetrate a designated surface area of the semiconductor body and become localized within that designated area, thus converting that portion of the semiconductor to an opposite conductivity type.

Predetermined geometric configurations of impurity elements can be formed either on the surface of the semiconductor body or within interior portions thereof by utilizing ion implantation techniques. The preselected geometric patterns are formed by using a deflection system which sweeps an ion beam focused to an appropriate cross section over the semiconductor body or else by interposing a suitable apertured mask between the ions source and the semiconductor body.

With the masking technique, the doping ions are implanted through a mask which is composed of a material chosen for its ability both to stop the high energy ions and to define accurately the small and complex geometrics characteristics of microelectronic arrays. In general, this technique utilizes three types of masks. The first type involves the use of a metal mesh held against the semiconductor surface. However, metal mesh masks can be used only for preparing simple arrays of fairly large elements. This type of mask does not lend itself to the fabrication of complex shapes or small sizes. In addition, since several processing steps are usually necessary on a given small area of a device array, it is necessary to insure that all the masks used in the processing steps can be put over the surface good registry.

Dielectric masks prepared by photoresist techniques constitute the second type of mask utilized in the ion implantation process. These masks comprise dielectric films deposited on the surface of the semiconductor and may consist of a layer of photoresist or an oxide film. The films generally do not contain a high proportion of heavy atoms, and thus, are not very effective at stopping heavy high energy ions. In addition, dielectric masks tend to become charged by the implanting ions that they stop. This charge inhibits other ions from reaching the surface in which they are to be implanted. Because of this it is often necessary to flood the sample surface with an electron beam during the implant in order to discharge the dielectric mask. This adds to the complexity and cost of the implant operation.

The formation of metal films by evaporation, sputtering or chemical deposition onto the surface of a semiconductor body and defined into a mask geometry by the use of conventional photoresist techniques constitutes the third type of ion implantation masking. Evaporated or sputtered metal films deposited on the surface of the specimen eliminate most of the problems of the mesh mask. These films can be selectively etched away from the areas of the semiconductor body that are to be bombarded and the use of photoresist techniques in the selective etching allows one to define arrays with photolithographic precision. However, metal film masks are generally rather thin, and thus, cannot mask against deep implants. Also, expensive evaporators or sputtering equipment are required to prepare them whenever the films are formed using those techniques.

With the present invention, however, the problems encountered when using previously known ion implantation masking techniques has been overcome through the use of lead sulfide film mask. The lead sulfide film provides a convenient, inexpensive mask for ion beam implantation and is especially useful for defining microelectronic arrays of circuit elements in semiconductors.

SUMMARY OF THE INVENTION

In accordance with the present invention, it has been found that a lead sulfide film provides an effective mask for use with the ion beam implantation system for doping semiconductor bodies. In using lead sulfide as an ion implantation mask, a thin film of lead sulfide is deposited on the surface of a semiconductor body and then the mask geometry is defined by selectively etching away parts of the lead sulfide through the use of conventional photoresist techniques. By using standard photoresist techniques, it is possible to etch the lead sulfide films with photolithographic precision. Thus, it is possible to fabricate complex arrays of small elements with much greater precision than previously possible with the metal mesh masks utilized heretofore.

Accordingly, the primary object of this invention is to provide a novel masking technique for use during the ion beam implantation of dopants onto semiconductor bodies.

Another object of this invention is to provide a method for forming a lead sulfide film mask on the surface of a semiconductor body.

Still, another object of this invention is to provide a convenient, effective and inexpensive technique for masking predetermined circuit patterns on semiconductor devices during the ion implantation of impurity atoms onto the surface of the semiconductor base material.

The above and still other objects and advantages of the present invention will become readily apparent upon consideration of the following detailed description thereof when taken in conjunction with the accompanying drawings.

A BRIEF DESCRIPTION OF THE DRAWING

DESCRIPTION OF THE PREFERRED EMBODIMENTS

Figure 1:
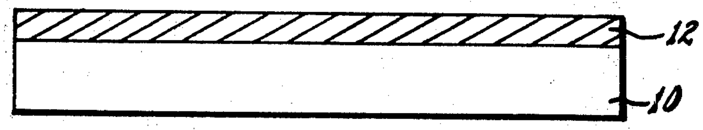
FIG. 1 is a sectional view of a lead sulfide coated semiconductor wafer.
Figure 2:
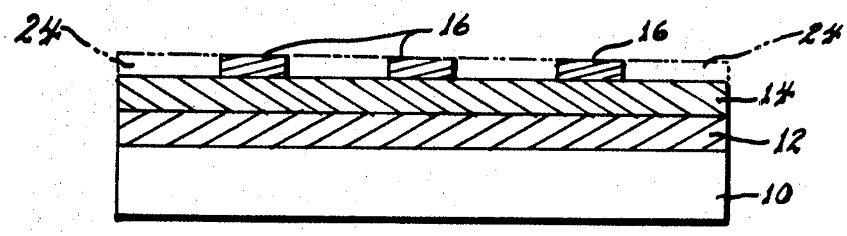
FIGS. 2 and 3 are sectional view showing the formation of a lead sulfide mask on the wafer of FIG. 1.

In accordance with this invention, the objects and advantages referred to heretofore are attained by providing a semiconductor wafer with a lead sulfide mask prior to the ion beam implantation of dopant material onto the surface of the semiconductor wafer.

The lead sulfide film may be formed by evaporation, sputtering, or by chemical deposition or precipitation from a high pH solution. Although any of these methods yield a suitable masking film, the chemical deposition or precipitation method has been found to be the most effective. There are a variety of techniques for chemically depositing a lead sulfide film. Most of these techniques involve a reaction between lead acetate or nitrate and thiourea in a basic solution. One technique found to be especially effective is described as follows: A solution is formed by mixing 1 part by weight 0.34 molar lead acetate, 2 parts by weight 0.35 molar thiourea and 0.003 parts by weight of 99 percent hydracine. A cleansed semiconductor wafer is placed into a beaker containing the above solution and allowed to stand for 2 minutes. 0.25 parts by weight of 17.5 molar sodium hydroxide solution is then added to the beaker and stirred until a mirror begins to form in the beaker. The wafer is allowed to stand in the solution from 5 to 30 minutes. The wafer is then removed, washed with water and then dried carefully.

After deposition, the lead sulfite film is formed into a mask though the use of conventional photoengraving techniques. These techniques are well known in the prior art and, in general, involve delineating the mask design by placing a layer of a suitable photoresist material, such as Eastman Kodak Company's KMER, onto the surface of the lead sulfide film. The film is exposed and the photoresist is developed in the conventional manner to leave a layer of photoresist over the areas that are to be masked during the deposition. The lead sulfide is then etched away from the uncovered areas. A suitable etching solution can be prepared by mixing equal parts of concentrated hydrochloric acid and a 10 percent thiourea solution. The coated semiconductor material is then washed and the photoresist is stripped from the masked areas with a suitable solvent, such as xylene. Once the mask has been prepared, the semiconductor body is inserted into an ion implantation apparatus and the implant operation carried out. Following the implant, the mask may be stripped from the semiconductor body by swabbing with the hydrochloric acid-thiourea solution described above.

The chemically deposited lead sulfide films of this invention are usually on the order of one-half to 2 microns thick and can be expected to mask implants that are being put into the sample an equal distance. This constitutes a decided advantage for the method of this invention since it is very inconvenient to provide such thick films when one is preparing a mask from an evaporated or sputtered metal film. Further, since half of the atoms in a lead sulfide film are lead, which is very good at stopping heavy high energy ions because of its large mass, it is theorized that the lead sulfide film is better at stopping high energy ions than equal thickness of common masking metals, such as aluminum.

A further advantage in using lead sulfide films for masking is the fact that such films can be deposited on semiconductor bodies using a minimum of commonly available labware (i.e., beakers, graduated cylinders, etc.) and a few common and inexpensive chemicals. Evaporated and sputtered films, on the other hand, require the use of expensive capital equipment. Also, the lead sulfide implantation mask is electrically conducting, so that no electron flood beam is required on the semiconductor surface to prevent mask charge-up, as is the case when suing a dielectric film mask.

Figure 3:
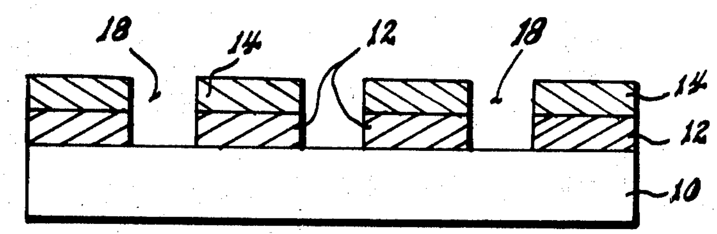
Figure 4:
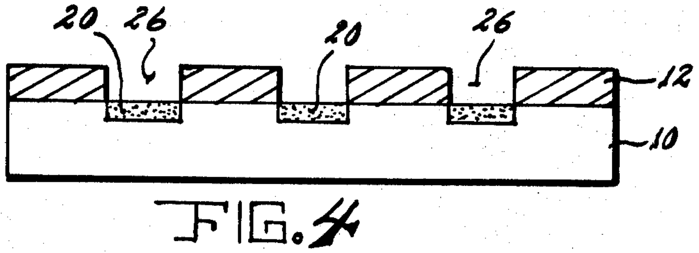
FIG. 4 is a sectional view of the wafer of FIG. 1 after ions have been implanted in discrete areas.

For the purpose of providing a more detailed description of a preferred embodiment of the invention, reference is now made to the drawings wherein FIGS. 1 to 5 show a semiconductor device at various stages in its manufacture. As shown in all the figures, a wafer 10 of a germanium semiconductor material having an N-type impurity therein is provided with a lead sulfide film 12 about 1 micron thick. The film 12 covers the entire upper surface of the wafer 10 and is deposited thereon by immersing the wafer in the lead acetate/thiourea solution described heretofore. After removal from the solution, the wafer 10 is washed and dried. A conventional photoresist material 14 is then placed over the lead sulfide film 12. A photographic mask 24, having opaque areas 16 corresponding to the predetermined circuit design to be formed on the surface of the wafer 10, is in turn placed over the layer 14. The photoresist layer 14 is then exposed through the photographic mask and photographically developed in a conventional manner. As shown in FIG. 3, the photographic mask 24 is removed and the unexposed areas 18 of the photoresist layer 14 is washed away leaving portions, not shown, of the lead sulfide film uncovered. The uncovered portions of the film 12, which lie under and correspond to areas 18, are then adjusted to the action of a conventional chemical etching solution to form an array of 0.016 inch holes 26 in the film 12 and thus expose the underlying areas of the wafer 10. The chemical etching solution may be prepared by mixing equal parts of concentrated hydrochloric acid and 10 percent throurea solution. The etching solution etches through the lead sulfide film 12 to the surface of the semiconductor as shown in FIG. 3. The photoresist material 14 is then stripped away by using a suitable solvent such as xylene thereby forming the lead sulfide mask of this invention.

After preparing the lead sulfide film mask as outlined above, the semiconductor to wafer 10 was inserted into a conventional ion implantation apparatus and aluminum ions 20 were implanted at 20kev., to a total dosage level of $10^{12}$ cm.$^{12}$ at room temperature. After implantation, the lead sulfide mask 12 was stripped away from the germanium wafer 10 by swabbing with the chemical etching solution described above.

Figure 5:
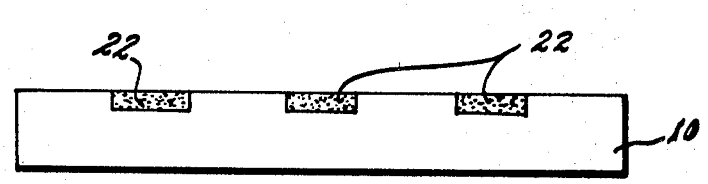
FIG. 5 is a sectional view after the lead sulfide mask has been removed from the wafer of FIG. 1.

As shown in FIG. 5, this resulted in the formation of an array of PN diodes 22 in an N-type germanium wafer 10. Tests made with a hot probe tester and with a transistor curve tracer confirmed that the implanted regions were P-type that there were PN diodes between the implanted regions and a back contact to the N-type wafer, and that the individual elements of the diode array were electrically isolated from each other (i.e., the implanted ions did not penetrate the mask).

The present invention solves many of the problems encountered during the ion beam implantation of dopant materials into semiconductor materials. It is especially useful in defining microelectronic arrays of circuit elements such as those involved in the production of photo diodes. The technique of the invention is versatile and applicable to any type of semiconductor fabrication utilizing ion implantation.

What is claimed is:

1. A method for forming preselected electrical circuit patterns having a first type of conductivity in the body of a semiconductor material having a second type of conductivity which comprises forming a thin film of lead sulfide on the surface of the semiconductor material, delineating a preselected mask geometry in said lead sulfide film to expose preselected surface portions of said semiconductor material, impinging a beam of high velocity ions of an impurity element characteristic of the said first type of conductivity upon the exposed surface portions of said semiconductor for a period of time and at an energy level sufficient to allow the said ions to penetrate the surfaces of the said exposed areas and form an area of conductivity corresponding to said first type of conductivity, and removing said lead sulfide mask from said ion implanted semiconductor material.